United States Patent
Chen

(10) Patent No.: US 9,165,823 B2
(45) Date of Patent: Oct. 20, 2015

(54) 3D STACKING SEMICONDUCTOR DEVICE AND MANUFACTURING METHOD THEREOF

(71) Applicant: Macronix International Co., Ltd., Hsinchu (TW)

(72) Inventor: Shih-Hung Chen, HsinChu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 117 days.

(21) Appl. No.: 13/736,104

(22) Filed: Jan. 8, 2013

(65) Prior Publication Data

US 2014/0191388 A1   Jul. 10, 2014

(51) Int. Cl.
| | |
|---|---|
| *H01L 29/792* | (2006.01) |
| *H01L 29/788* | (2006.01) |
| *H01L 29/66* | (2006.01) |
| *H01L 29/40* | (2006.01) |
| *H01L 21/768* | (2006.01) |
| *H01L 27/115* | (2006.01) |

(52) U.S. Cl.
CPC .... *H01L 21/76838* (2013.01); *H01L 27/11548* (2013.01); *H01L 27/11575* (2013.01); *H01L 27/11556* (2013.01); *H01L 27/11582* (2013.01); *H01L 2924/0002* (2013.01)

(58) Field of Classification Search
CPC ............... H01L 27/11582; H01L 27/11578; H01L 27/11556; H01L 27/11551; H01L 27/11529; H01L 29/66833; H01L 29/7926; H01L 23/485; H01L 21/76838

USPC .................. 257/324, 315, 319, 773, E29.309, 257/E21.423, E21.614
See application file for complete search history.

(56) References Cited

U.S. PATENT DOCUMENTS

| | | | |
|---|---|---|---|
| 2010/0052042 A1* | 3/2010 | Tanaka et al. ................. | 257/324 |
| 2010/0207186 A1* | 8/2010 | Higashi et al. ................ | 257/314 |
| 2012/0306089 A1* | 12/2012 | Freeman et al. .............. | 257/773 |

FOREIGN PATENT DOCUMENTS

| | | |
|---|---|---|
| TW | 100139431 | 10/2011 |
| TW | 201232701 | 8/2012 |
| TW | 201236108 | 9/2012 |

OTHER PUBLICATIONS

English abstract translation of TW201232701 (Published Aug. 1, 2012).
English abstract translation of TW201236108 (Published Sep.1, 2012).
English abstract translation of TW100139431 (Published Oct. 28, 2011).

* cited by examiner

*Primary Examiner* — Fernando L Toledo
*Assistant Examiner* — Aaron Gray
(74) *Attorney, Agent, or Firm* — McClure, Qualey & Rodack, LLP

(57) ABSTRACT

A 3D stacking semiconductor device and a manufacturing method thereof are provided. The manufacturing method includes the following steps. N layers of stacking structures are provided. Each stacking structure includes a conductive layer and an insulating layer. A first photoresist layer is provided. The stacking structures are etched P-1 times by using the first photoresist layer as a mask. A second photoresist layer is provided. The stacking structures are etched Q-1 times by using the second photoresist layer as a mask. The first photoresist layer is trimmed along a first direction. The second photoresist layer is trimmed along a second direction. The first direction is different from the second direction. A plurality of contact points are arranged along the first and the second directions in a matrix. The included angle between the first direction and the second direction is an acute angle.

12 Claims, 16 Drawing Sheets

3D STACKING SEMICONDUCTOR DEVICE AND MANUFACTURING METHOD THEREOF

BACKGROUND

1. Technical Field

The disclosure relates in general to a semiconductor device and a manufacturing method thereof, and more particularly to a 3D stacking semiconductor device and a manufacturing method thereof.

2. Description of the Related Art

With the development of semiconductor technology, various semiconductor elements are provided. The semiconductor elements can be installed to realize varied electric performance. Semiconductor elements are widely used in electronic products.

Under the trends of lightweight, thin, short and small, how to reduce the volume of the semiconductor element or increase the circuit density at a fixed volume becomes an important target in the semiconductor industries.

SUMMARY

The disclosure is directed to a 3D stacking semiconductor device and a manufacturing method thereof.

According to a first aspect of the present disclosure, a manufacturing method of a 3D stacking semiconductor device is provided. The manufacturing method of the 3D stacking semiconductor device comprises the following steps. N layers of stacking structures are provided. Each stacking structure includes a conductive layer and an insulating layer. The conductive layers and the insulating layers are interlaced. $N \leq P \times Q$. N, P and Q are positive numbers. A first photoresist layer is provided. The first photoresist layer covers part of the surface of the stacking structures. The stacking structures are etched P-1 times by using the first photoresist layer as a mask. In each step of etching the stacking structures, the stacking structures are etched for a thickness of one layer. The first photoresist layer is trimmed for a width at each of the 1 to P-2 steps. The first photoresist layer is removed. A second photoresist layer is provided. The second photoresist layer covers part of the surface of the stacking structures. The stacking structures are etched Q-1 times by using the second photoresist layer as a mask. In each step of etching the stacking structures, the stacking structures are etched for another thickness of P layers. The second photoresist layer is trimmed for another width of P layers after each of the 1 to Q-2 steps. The second photoresist layer is removed. N conductive lines are provided. Each conductive line is electrically connected to a contact point of each conductive layer. The first photoresist layer is trimmed along a first direction. The second photoresist layer is trimmed along a second direction. The first direction is different from the second direction. A plurality of contact points are arranged in a matrix along the first and the second directions. The included angle between the first direction and the second direction is an acute angle.

According to a second aspect of the present disclosure, a 3D stacking semiconductor device is provided. The 3D stacking semiconductor device includes N layers stacking structures and N pieces of conductive lines. Each stacking structure includes a conductive layer and an insulating layer. N is a positive number. The conductive layer and the insulating layer are interlaced and stacked. Each conductive line is electronically connected to one contact point of each conductive layer. The contact points are arranged along a first direction to form a P stages stair structure having a single layer interval. The contact points are arranged along a second direction to form a Q stages stair structure having a P stages interval. $N \leq P \times Q$. The contact points are arranged in a matrix along the first direction and the second direction. An included angle between the first direction and the second direction is an acute angle.

The above and other aspects of the disclosure will become better understood with regard to the following detailed description of the non-limiting embodiments. The following description is made with reference to the accompanying drawings.

DETAILED DESCRIPTION

Preferred embodiments are disclosed below for elaborating the invention. The following embodiments are for the purpose of elaboration only, not for limiting the scope of protection of the invention. Besides, secondary elements are omitted in the following embodiments to highlight the technical features of the invention.

Figure 1:
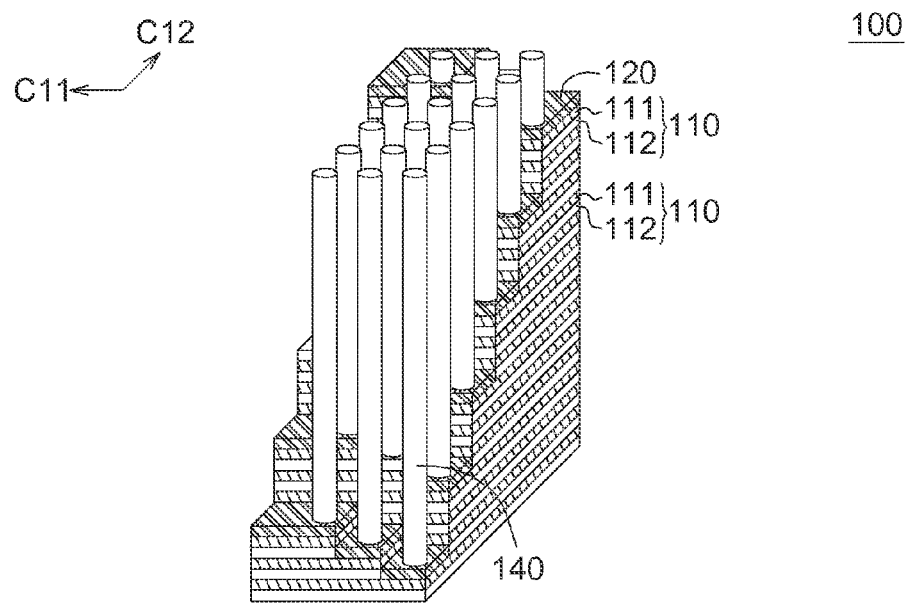
FIG. 1 shows a 3D stacking semiconductor device.

Please refer to FIG. 1, which shows a 3D stacking semiconductor device 100. The 3D stacking semiconductor device 100 includes N layers stacking structure 110 and N pieces of conductive lines 140. Each stacking structure 110 includes a conductive layer 111 and an insulating layer 112. N is a positive number. For example, N can be 18. Each conductive layer 111 has a stopping layer 120. The conductive line 140 is electronically connected to the conductive layer 111 by penetrating the stopping layer 120, for transmitting signals from the conductive layers 111 respectively. Due to the design of the 3D stacking semiconductor device 100, the N layers conductive layer 111 can be compactly stacked, and the conductive lines 140 can be arranged closely.

Figure 2A:
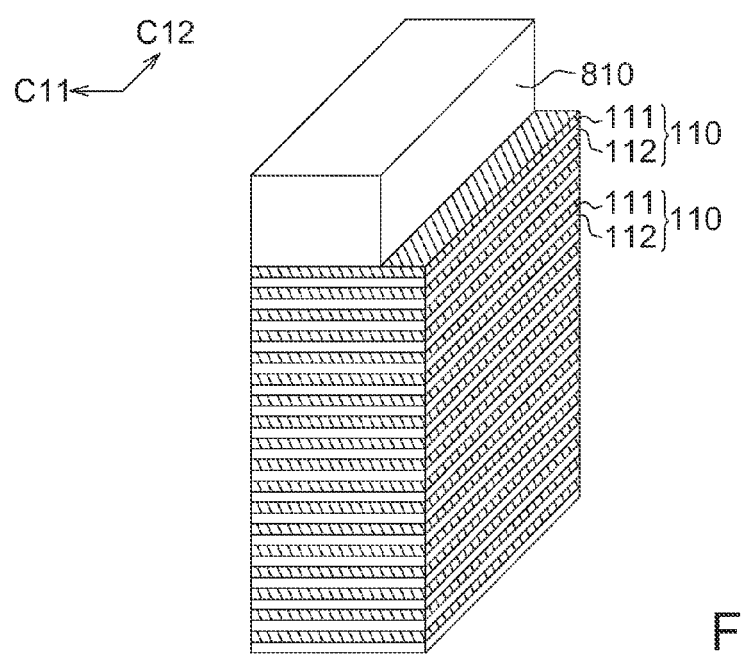
FIGS. 2A to 2R show a flow chart of a manufacturing method of the 3D stacking semiconductor device.
Figure 2B:
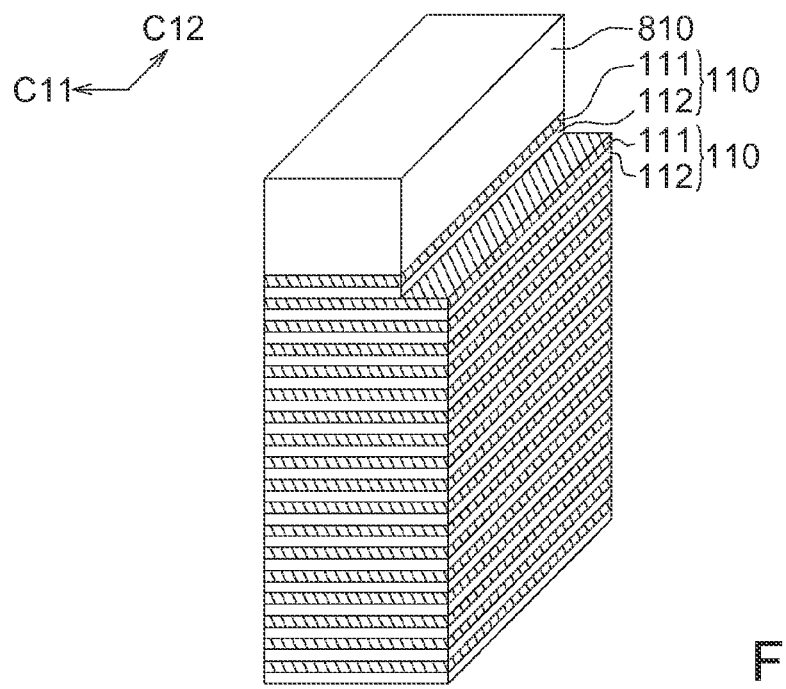
Figure 2C:
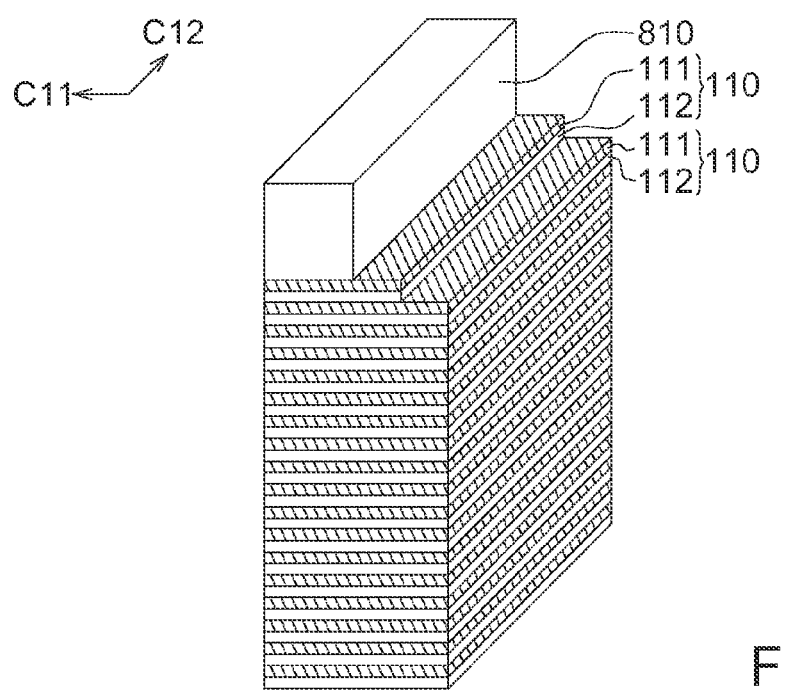
Figure 2D:
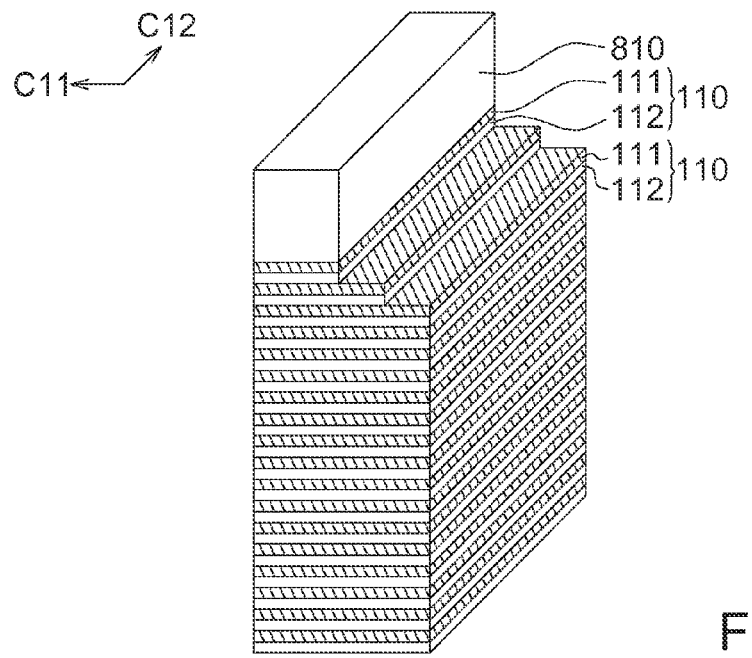
Figure 2E:
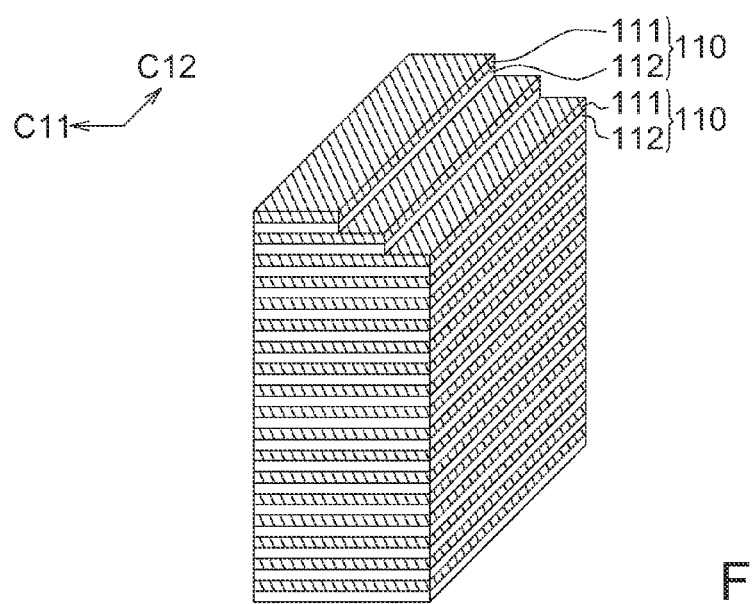
Figure 2F:
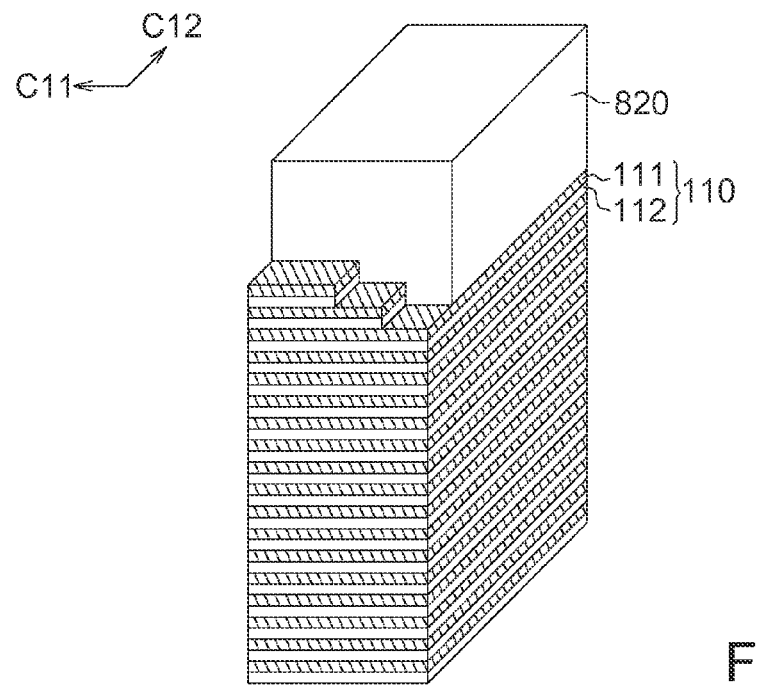
Figure 2G:
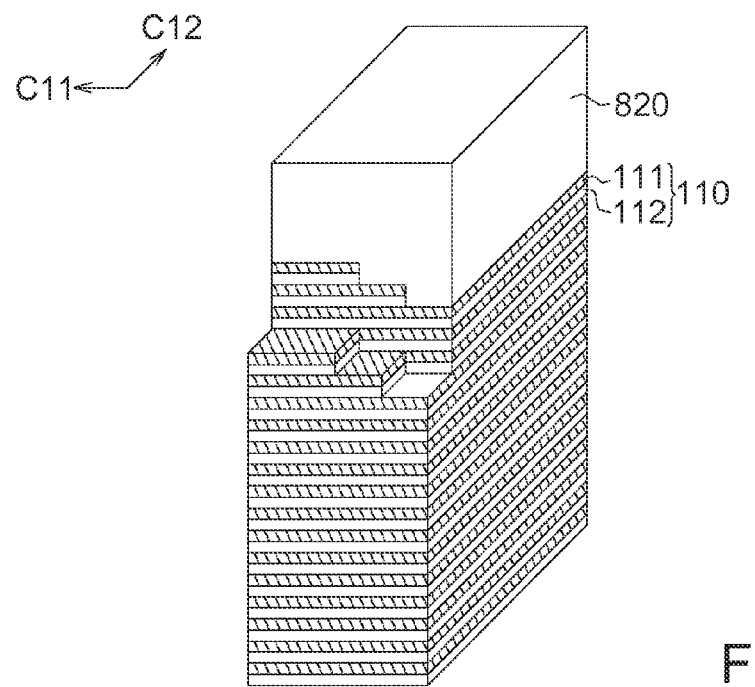
Figure 2H:
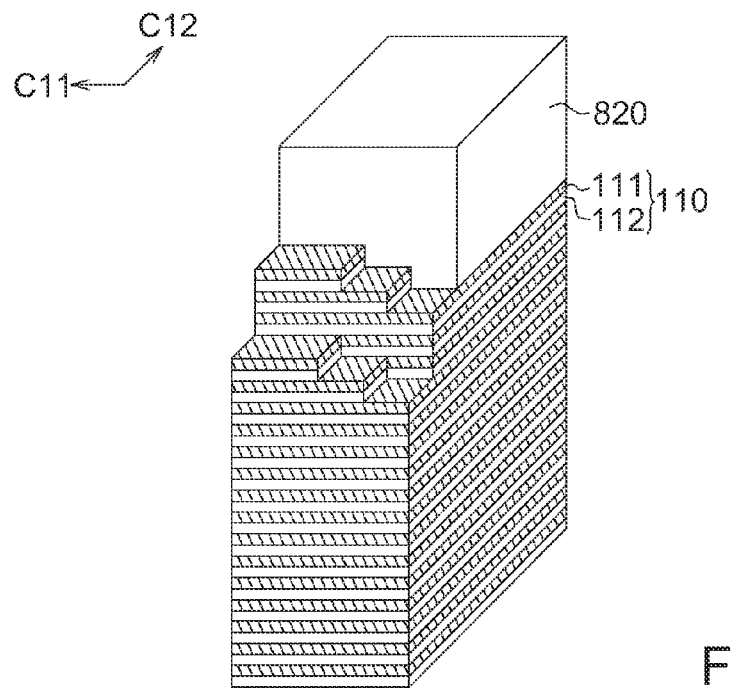
Figure 2I:
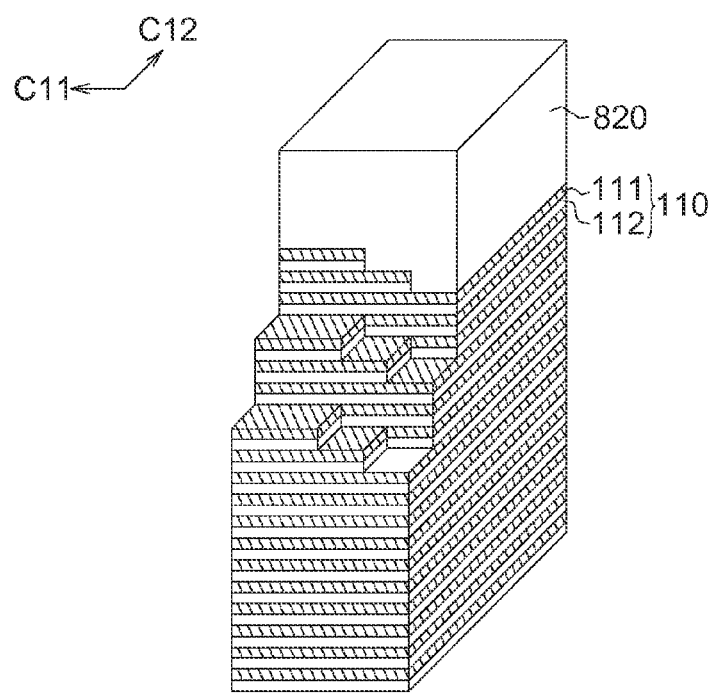
Figure 2J:
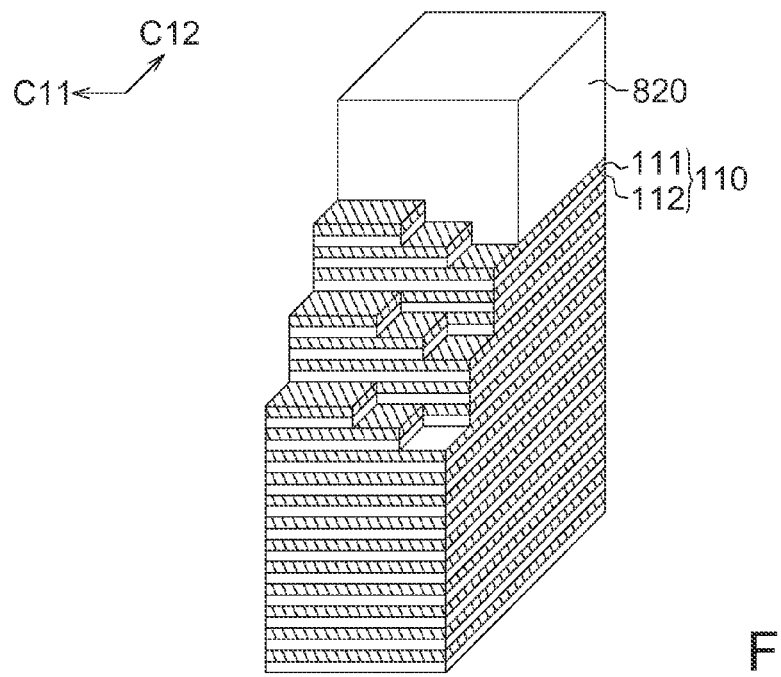
Figure 2K:
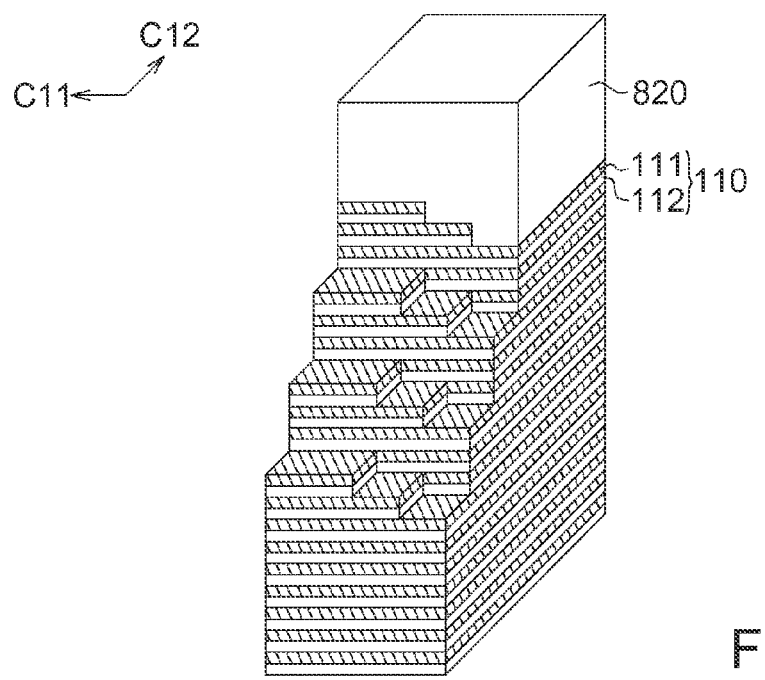
Figure 2L:
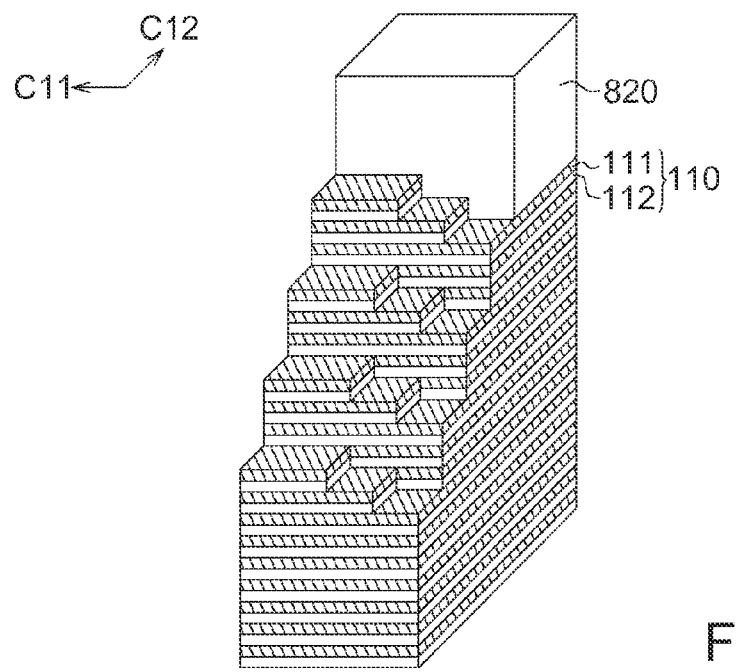
Figure 2M:
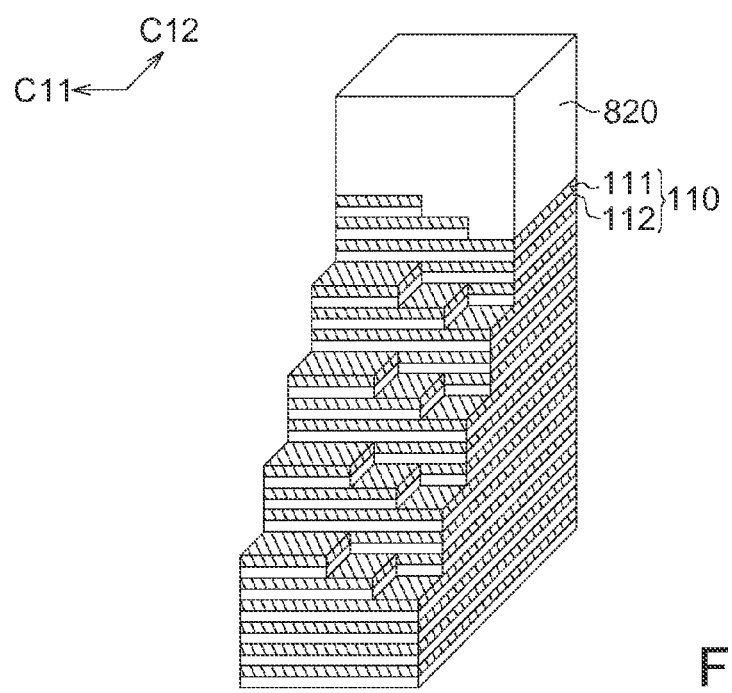
Figure 2N:
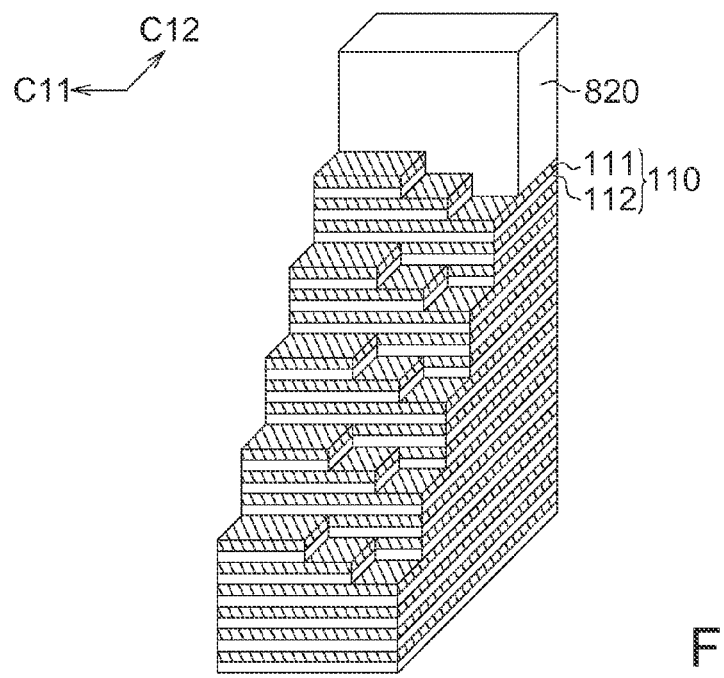
Figure 2O:
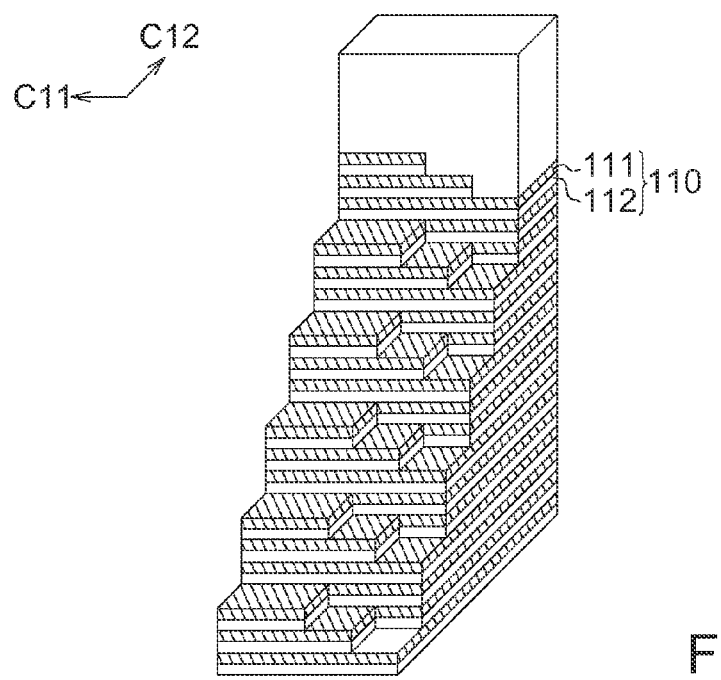
Figure 2P:
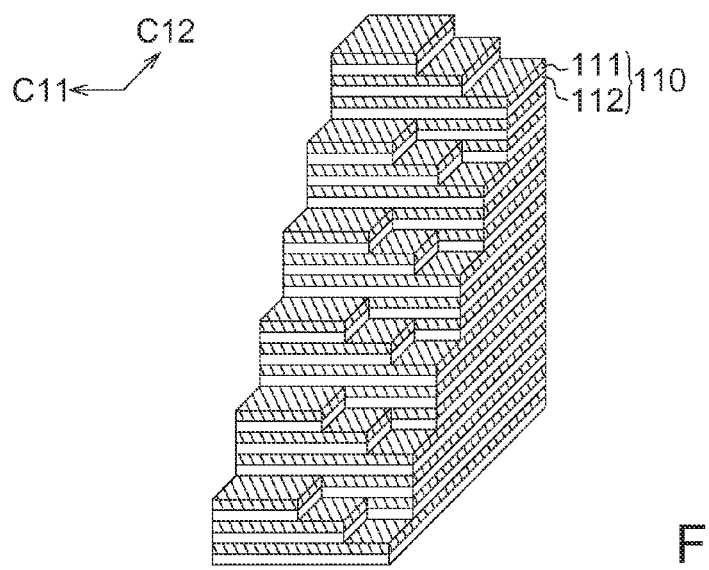
Figure 2Q:
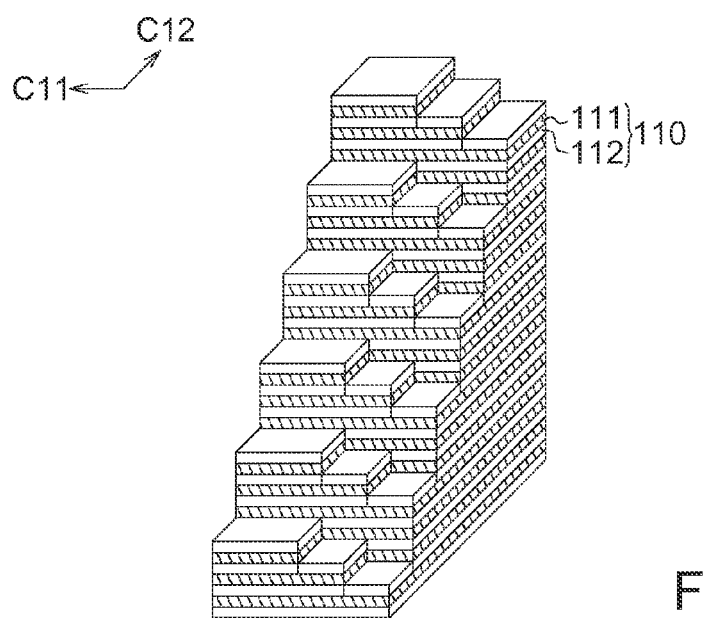
Figure 2R:
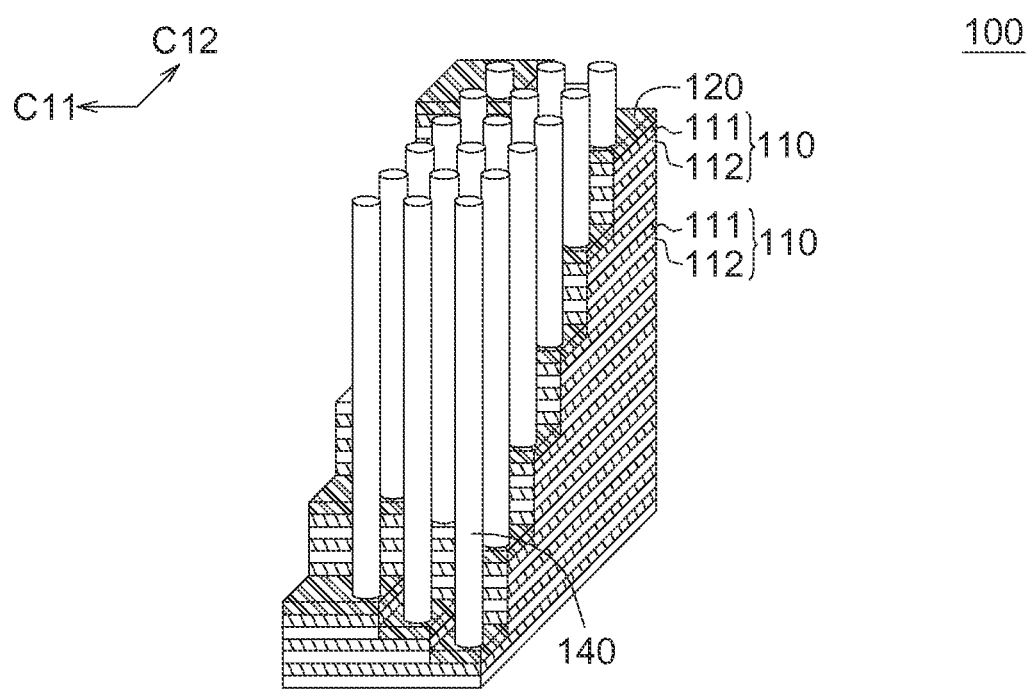

Please refer to FIGS. 2A to 2R, which shows a flow chart of a manufacturing method of the 3D stacking semiconductor device 100. In one embodiment, the 3D stacking semiconductor device 100 can be formed by a plurality of photoresist layers and a manner of trimming with multiple directions. In FIGS. 2A to 2R, the 3D stacking semiconductor device 100 with N layers of stacking structures 110 is formed by two photoresist layers and a manner of trimming with two directions.

As shown in FIGS. 2A to 2E, a P stages stair structure is formed by a first photoresist layer 810. P is a positive number. For example, P can be 3. As shown in FIGS. 2F to 2P, a Q stages stair structure is formed by a second photoresist layer 820. Q is another positive number. For example, Q can be 6. $N \leq P \times Q$. For example, $18 \leq 3 \times 6$. Hereafter, N, P and Q are exemplified by 18, 3 and 6 respectively.

In FIG. 2A, the stacking structures 110 are provided. At this time, 18 layers of stacking structures 110 are not etched. 18 layers of conductive layer 111 and 18 layers of insulating layer 112 are interlaced and stacked compactly.

In FIG. 2A, the first photoresist layer 810 is provided. The first photoresist layer 810 covers part of the surface of the 18 layers of stacking structure 110.

In FIG. 2B, the stacking structures 110 are etched by using the first photoresist layer 810 as a mask. In this step of etching the stacking structures 110, the exposed portion of the stacking structures 110 is etched for a thickness of one layer.

In FIG. 2C, the first photoresist layer 810 is trimmed for a width along a first direction C11, such that two layers of the stacking structures 110 are exposed.

In FIG. 2D, the stacking structures 810 are etched by using the trimmed first photoresist layer 810 as a mask. In this step of etching the stacking structure, the exposed portion of the stacking structures 110 is etched for a thickness of one layer. That is to say, part of the first layer and the second layer of the stacking structures 110 are etched for a thickness of one layer.

In FIG. 2E, the first photoresist layer 810 is removed to form 3 stages.

In FIGS. 2A to 2E, the stacking structures 110 are etched 2 times (i.e. P-1 times). In etch step of etching, the exposed portion of the stacking structures 110 is etched for a thickness of one layer, and the first photoresist layer 810 is trimmed for a width along the first direction C11 after the first step (i.e. the P-2 step) of etching the stacking structures 110. In FIGS. 2A to 2E, it is exemplified by 3 stages. If the process is inferred to P stages, then the stacking structures 110 are etched P-1 times by using the first photoresist layer 810 as a mask. In each step of etching the stacking structures 110, the stacking structures 110 are etched for a thickness of one layer, and the first photoresist layer 810 is trimmed for a width along the first direction after each of the 1 to P-2 steps of etching the stacking structures 110.

Afterwards, in FIG. 2F, the second photoresist layer 820 is provided. The second photoresist layer 820 covers part of the surface of the stacking structures 110.

In FIG. 2G, the stacking structures 110 are etched by using the second photoresist layer 820 as a mask. In this step of etching the stacking structures 110, the exposed portion of the stacking structures 110 is etched for a thickness of 3 layers. That is to say, part of the 1 to 3 layers of the stacking structures 110 are etched for a thickness of 3 layers at the same time.

In FIG. 2H, the second photoresist layer 820 is trimmed for a width along a second direction C12, such that 6 layers of the stacking structures 110 ate exposed.

In FIG. 2I, the stacking structures 110 are etched by using the trimmed second photoresist layer 820 as a mask. In this step of etching the stacking structure 110, the exposed portion of the stacking structures 110 is etched a thickness of 3 layers. That is to say, part of the 1 to 6 layers of the stacking structures 110 are etched for a thickness of 3 layers at the same time.

In FIG. 2J, the second photoresist layer 820 is trimmed for a width along the second direction C12, such that 9 layers of the stacking structures 110 are exposed.

In FIG. 2K, the stacking structures 110 are etched by using the trimmed second photoresist layer 820 as a mask. In this step of etching the stacking structure 110, the exposed portion of the stacking structures 110 is etched for a thickness of 3 layers. That is to say, part of the 1 to 9 layers of the stacking structures 110 are etched for a thickness of 3 layers at the same time.

In FIG. 2L, the second photoresist layer 820 is trimmed for a width along the second direction C12, such that 12 layers of the stacking structure 110 are exposed.

In FIG. 2M, the stacking structures 110 are etch by using the trimmed second photoresist layer 820 as a mask. In this step of etching the stacking structures 110, the exposed portion of the stacking structures 110 is etched for a thickness of 3 layers. That is to say, part of the 1 to 12 layers of the stacking structures 110 are etched for a thickness of 3 layers at the same time.

In FIG. 2N, the second photoresist layer 820 is trimmed for a width along the second direction C12, such that 15 layers of the stacking structures 110 are exposed.

In FIG. 2O, the stacking structures 110 are etched by using the trimmed second photoresist layer 820 as a mask. In this step of etching the stacking structure, the exposed portion of the stacking structure 110 is etched for a thickness of 3 layers. That is to say, part of the 1 to 15 layers of the stacking structure 110 are etched for a thickness of 3 layers.

In FIG. 2P, the second photoresist layer 820 is remove to form 18 stages.

In FIGS. 2F to 2P, the stacking structures 110 are etched 5 times (i.e. Q-1 times). In each step of etching the stacking structure, the exposed portion of the stacking structures 110 is etched for a thickness of 3 layers (i.e. P layers), and the second photoresist layer 820 is trimmed for a width along the second direction C12 after each of the 1 to 4 steps (i.e. the 1 to Q-2 steps) of etching the stacking structure 110. In FIGS. 2E to 2P, it is exemplified by 6 stages. If the process is inferred to Q stages, then the stacking structures 110 are etched Q-1 times by using the second photoresist layer 820 as a mask. In each step of etching the stacking structures 110, the stacking structures 110 are etched for a thickness of P layers, and the second photoresist layer 820 are trimmed for a width along the second direction C12 after each of the 1 to Q-2 steps of etching the stacking structure 110.

In FIG. 2Q, a plurality of stopping layer 120 are formed on the exposed portion of the stacking structure 110.

In FIG. 2R, a plurality of stopping layer 120 are formed on the exposed conductive layer 111 of the stacking structures 110, and a plurality of conductive lines 140 are provided for electronically connected to the conductive layer 111 by penetrating the stopping layer 120.

As such, 18 stages can be formed in the 3D stacking semiconductor device 100 with small volume. In FIGS. 2A to 2E, the first photoresist layer 810 is trimmed for a width along the first direction C11; in FIGS. 2F to 2P, the second photoresist layer 820 is trimmed for another width along the second direction C12. The first direction C11 is different from the second direction C12, such that the several stages can be formed along the first direction C11 and the second direction C12 to interlace a stairs matrix.

In FIGS. 2A to 2R, the included angle between the first direction C11 and the second direction C12 is exemplified by a right angle. In one embodiment, the included angle between the first direction C11 and the second direction C12 can be an acute angle.

In the present embodiment, the 3D stacking semiconductor device 100 has N layers of stacking structures 110, there is the P stages stair structure having single layer interval located along the first direction C11, and there is the Q stages stair structure having P stages interval located along the second direction C12. In the present embodiment, N, P and Q are exemplified by 18, 3 and 6 respectively. In one embodiment, N, P and Q can be 18, 6 and 3; or 18, 9 and 2, on condition that P and Q are factors of N.

Figure 3A:
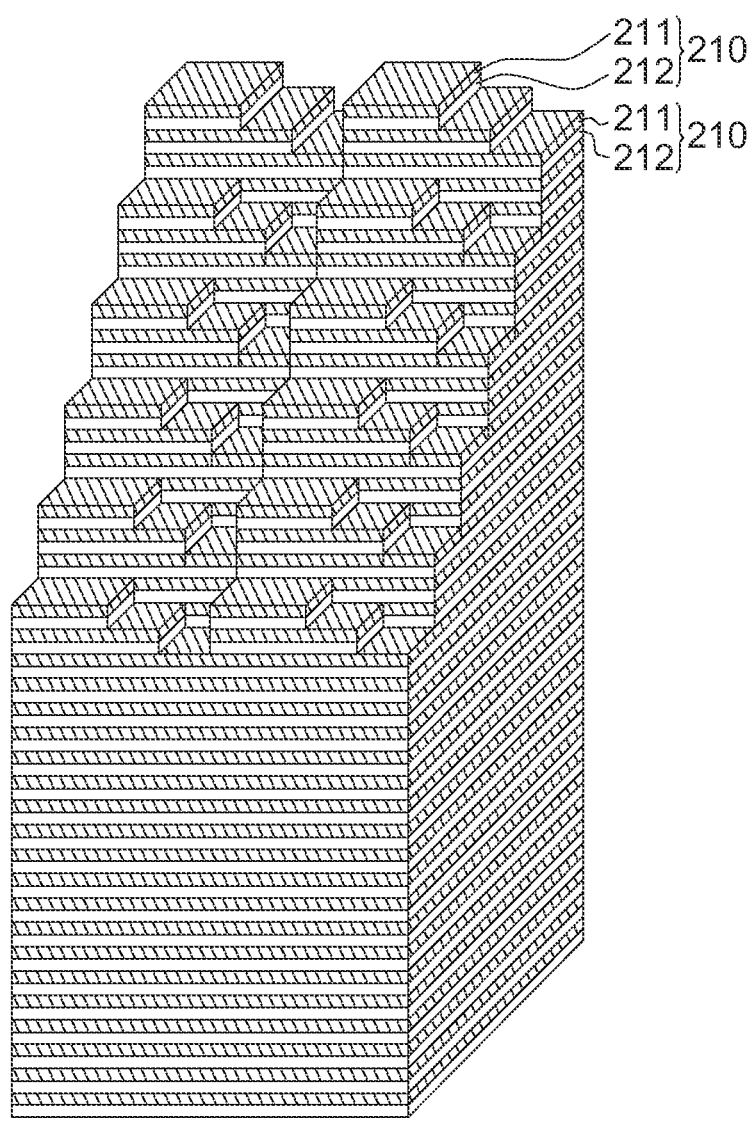
FIGS. 3A to 3B show flow chart of a manufacturing method of a 3D stacking semiconductor device.

In the above embodiments, the 3D stacking semiconductor device 100 is formed by two modules process, such as P stages and Q stages. In another embodiment, a 3D stacking semiconductor device 200 can be formed by three modules process, such as P stages, Q stages and R stages. Please refer to FIGS. 3A to 3B, which show a flow chart of a manufacturing method of the 3D stacking semiconductor device 200. In FIG. 3A, a P×Q stages stair structure formed by the P stages stair structure and the Q stages stair structure, such as 3×6 stages stair structure, can be formed by a process similar to FIGS. 2A to 2R.

Figure 3B:
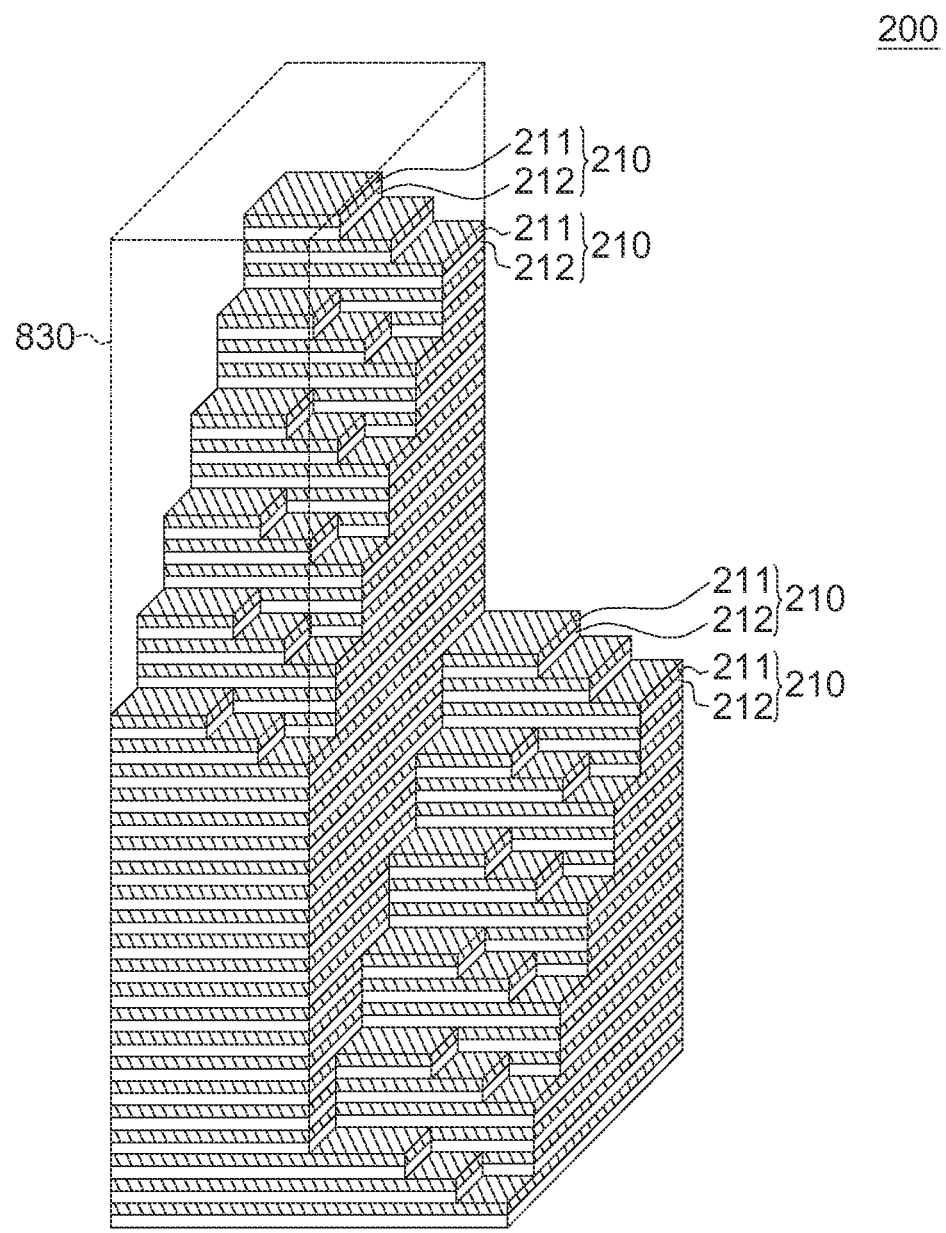

In FIG. 3B, a third photoresist layer 830 is provided. The third photoresist layer 830 covers part of the stacking structures 210. Each stacking structure 210 includes a conductive layer 211 and an insulating layer 212. Afterwards, the stacking structures 210 are etched by using the third photoresist layer 830 as a mask. In each step of etching the stacking structures 210, the stacking structures 210 are etched for a thickness of 18 layers. In FIGS. 3A to 3B, it is exemplified by 2 stages. If the process is inferred to R stages, then the stacking structures 210 are etched R-1 times by using the third photoresist layer 830 as a mask, in each step of etching the stacking structure 210, the stacking structures 210 are etched for a thickness of P×Q layers, and the third photoresist layer 830 is trimmed for a width after each of the 1 to R-2 steps of etching the stacking structure 210.

That is to say, a 3D stacking semiconductor device having N stages can be formed by three modules process, such as P stages, Q stages and R stages. P×Q stages stair structure can be arranged with P×Q stages interval along the first direction to form a P×Q×R stages structure. N, P, Q and R are positive numbers, N≤P×Q×R, and P, Q and R are factors of N.

Similarly, if the process is inferred next, 3D stacking semiconductor device having N stages can be formed by four modules process, such as P stages, Q stages, R stages and S stages. The P×Q×R stages stair structure can be arranged with P×Q×R stages interval along the second direction to form a P×Q×R×S stages structure. N, P, Q, R and S are positive numbers, N≤P×Q×R×S, and P, Q, R and S are factors of N. After P stages, Q stages and R stages of the 3D stacking semiconductor device are formed, a fourth photoresist layer can be provided. The fourth photoresist layer covers part of the stacking structures. Then, the stacking structures are etched S-1 times by using the fourth photoresist layer as a mask. In each steps of etching the stacking structures, the stacking structures are etched for a thickness of P×Q×R layers. The fourth photoresist layer is trimmed for a width after the each of the 1 to S-2 steps of etching the stacking structures.

According to the similar manners, a 3D stacking semiconductor device can be formed by more than five modules process.

Figure 4A:
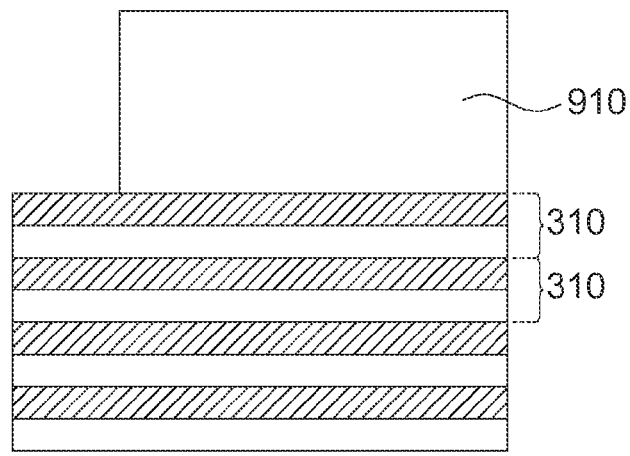
FIGS. 4A to 4C show the change of a photoresist layer during etch and trimming.
Figure 4B:
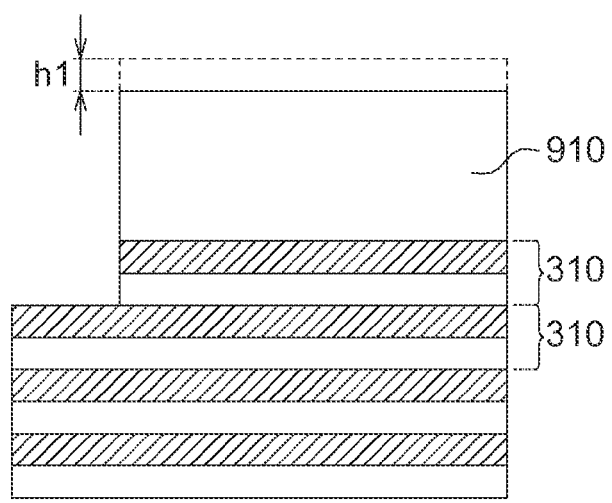
Figure 4C:
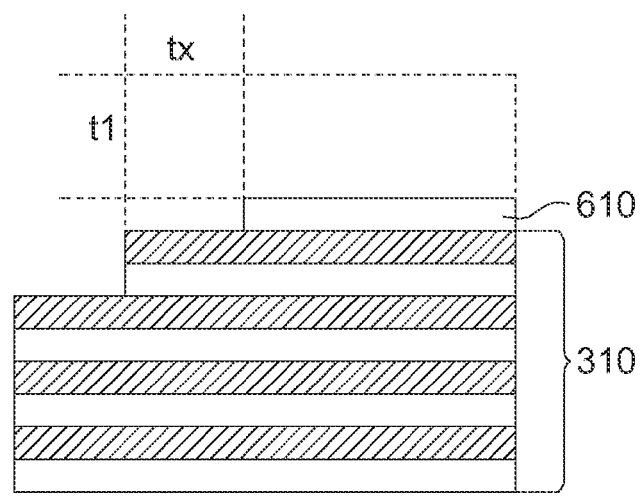

Please refer to FIGS. 4A to 4C, which show the change of a photoresist layer 910 during etch and trimming. As shown in FIGS. 4A to 4B, the photoresist layer 910 will be consumed for a thickness h1, such as about 500, during the process of etching the stacking structure 310. As shown in FIGS. 4B to 4C, the photoresist layer 910 will be consumed for a thickness t1, such as about 4000, during the process of trimming the photoresist layer 910 for a width tx. Thus, the consumption of the photoresist layer 910 is needed to be controlled during the steps of etching or the steps of trimming.

Take table 1 as an example, N is 36 and 3D stacking semiconductor device having 36 stages is formed by one module process. The number of trimming times is 34, and the number of etched layers is 35. The total consumption of the photoresist layer is 153500.

TABLE 1

| | | first module process | | | |
|---|---|---|---|---|---|
| serial numbers | N | first module process P | number of trimming times | number of etched layers | total consumption (Å) |
| 1-1 | 36 | 36 | 36 | 35 | 153500 |

Take table 2A as an example, N is 36 and 3D stacking semiconductor device having 36 stages is formed by two modules process. The first module process and the second module process can be exemplified by several combinations of P and Q, such as the combinations of No. 2-1, 2-2 and 2-3. As shown in table 2B, when the 6 stages are formed in the first module process and 6 stages are formed in the second module process, the total consumption is lowest.

Because the consumption of the photoresist layer in the second module process is larger than that in the first module process. Thus, Q≤P is a better choice according to the total consumption of the photoresist layer. For example, in number 2-1 of table 2B, the consumption of the photoresist layer in the first module process is 9500, and the consumption of the photoresist layer in the second module process is 44000 which is very high. In addition, the problems under a thick photoresist layer are the decreasing of the optical resolution and the limit of the thickness of the photoresist layer. Therefore, number 2-1 is not the best case. Numbers 2-2 or 2-3 are the better cases.

TABLE 2A

| serial numbers | N | first module process P | second module process Q |
|---|---|---|---|
| 2-1 | 36 | 4 | 9 |
| 2-2 | 36 | 6 | 6 |
| 2-3 | 36 | 9 | 4 |

TABLE 2B

| | first module process | | | second module process | | | total |
|---|---|---|---|---|---|---|---|
| serial number | number of trimming times | number of etched layers | Consumption (Å) | number of trimming times | number of etched layers | Consumption (Å) | consumption (Å) |
| 2-1 | 2 | 3 | 9500 | 7 | 32 | 44000 | 53500 |
| 2-2 | 4 | 5 | 18500 | 4 | 30 | 31000 | 49500 |
| 2-3 | 7 | 8 | 32000 | 2 | 27 | 21500 | 53500 |

Take table 3A as an example, N is 36 and 3D stacking semiconductor device having 36 stages is formed by three modules process. The first module process, the second module process and the third module process can be exemplified by several combinations of P, Q and R, such as the combinations of No. 3-1, 3-2, 3-3 and 3-4. As shown in tables 3B to 3C, when the 3 stages are formed in the first module process, 3 stages are formed in the second module process and 4 stages are formed in the third module process, the total consumption is lowest.

Usually, the reason to enter a next module process is that the thickness of the photoresist layer is reached a limit thereof, the accuracy is decreased due to the trimming or an enlarging requirement base on the design rule. For example, if the limit of the thickness of the photoresist layer is 20000, then there is no case which can be selected, and only numbers 3-2 and 3-4 can be selected in tables 3B to 3C.

Moreover, the consumption of the photoresist layer in the third module process is larger than that in the second module process. Thus, $R \leq Q \leq P$ is a better choice according to the total consumption of the photoresist layer.

According to the similar manners, on the case which four modules process are applied, $S \leq R \leq Q \leq P$ is the better choice.

TABLE 3A

| serial numbers | first module process N | second module process P | third module process Q | R |
|---|---|---|---|---|
| 3-1 | 36 | 3 | 6 | 2 |
| 3-2 | 36 | 6 | 3 | 2 |
| 3-3 | 36 | 3 | 3 | 4 |
| 3-4 | 36 | 4 | 3 | 3 |

TABLE 3B

| | first module process | | | second module process | | |
|---|---|---|---|---|---|---|
| serial numbers | number of trimming times | number of etched layers | consumption (Å) | number of trimming times | number of etched layers | consumption (Å) |
| 3-1 | 1 | 2 | 5000 | 4 | 15 | 23500 |
| 3-2 | 4 | 5 | 18500 | 1 | 12 | 10000 |
| 3-3 | 1 | 2 | 5000 | 1 | 6 | 7000 |
| 3-4 | 2 | 3 | 9500 | 1 | 8 | 8000 |

TABLE 3C

| | third module process | | | |
|---|---|---|---|---|
| serial numbers | number of trimming times | number of etched layers | Consumption (Å) | total consumption (Å) |
| 3-1 | 0 | 18 | 9000 | 37500 |
| 3-2 | 0 | 18 | 9000 | 37500 |
| 3-3 | 2 | 27 | 21500 | 33500 |
| 3-4 | 1 | 24 | 16000 | 33500 |

Figure 5:
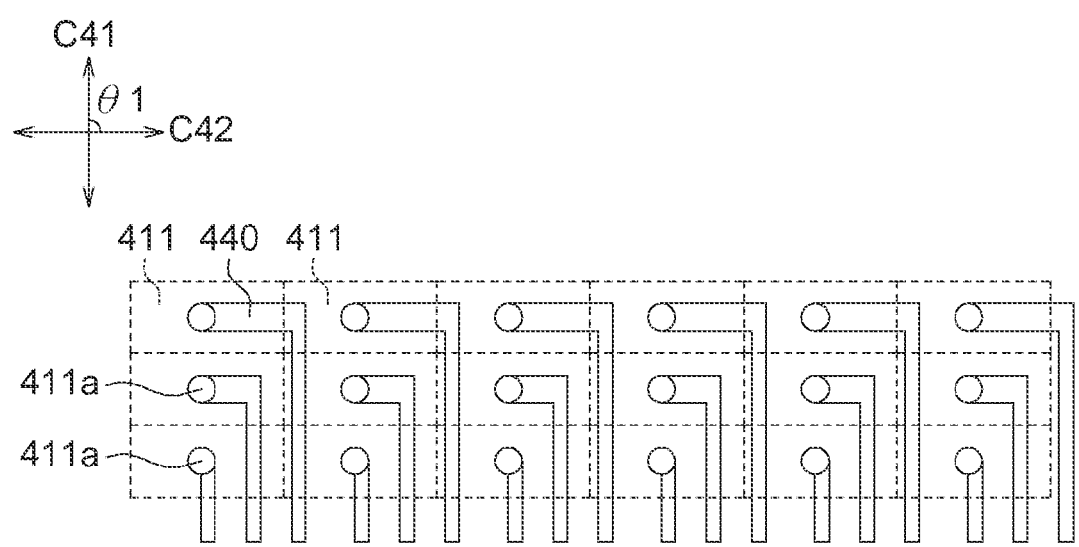
FIG. 5 shows an arrangement of conductive lines and contact points where the conductive lines are connected to the conductive layers.

Please refer to FIG. 5, which shows an arrangement of a plurality of conductive lines 440 and a plurality of contact points 411a where the conductive lines 440 are connected to the conductive layers 411. The above described 3D stacking semiconductor device can include a plurality of conductive layers 411 stacked compactly and a plurality of contact points 411a where the conductive lines 440 are connected to the conductive layers 411 arranged closely. Because the photoresist layer are trimmed along the first direction C41 and the second direction C42, the contact points 411a are arranged along the first direction C11 and the second direction C12 in a matrix accordingly. If an included angle θ1 between the first direction C41 and the second direction C42 is a substantially right angle, then the conductive lines 440 must be formed as L shaped to stagger the same.

Figure 6:
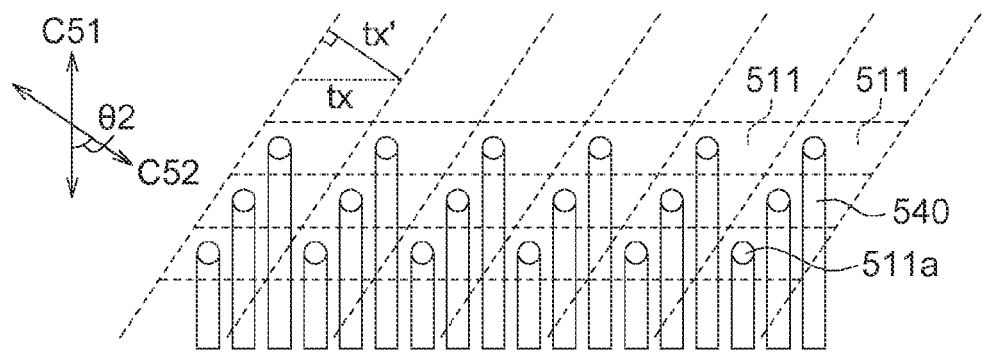
FIG. 6 shows an arrangement of conductive lines and contact points where the conductive lines are connected to the conductive layers.

Please refer to FIG. 6, which shows an arrangement of a plurality of conductive lines 540 and a plurality of contact points 511a where the conductive lines 540 are connected to the conductive layers 511. The above described 3D stacking semiconductor device can include a plurality of conductive layers 511 stacked compactly and a plurality of contact points 511a where the conductive lines 540 are connected to the conductive layers 511 arranged closely. Because the photoresist layer are trimmed along the first direction C51 and the second direction C52, the contact points 511a are arranged along the first direction C51 and the second direction C52 in a matrix accordingly. If an included angle θ2 between the first direction C51 and the second direction C52 is an acute angle, then the conductive lines 540 can be straightly extended from the contact points 511a in parallel and do not need to be formed as L shaped to stagger the same.

In addition, when the included angle θ2 between the first direction C51 and the second direction C52 is an acute angle, the width tx for which the photoresist layer is trimmed becomes width tx'. The width tx' is sin θ2 times the width tx.

Figure 7:
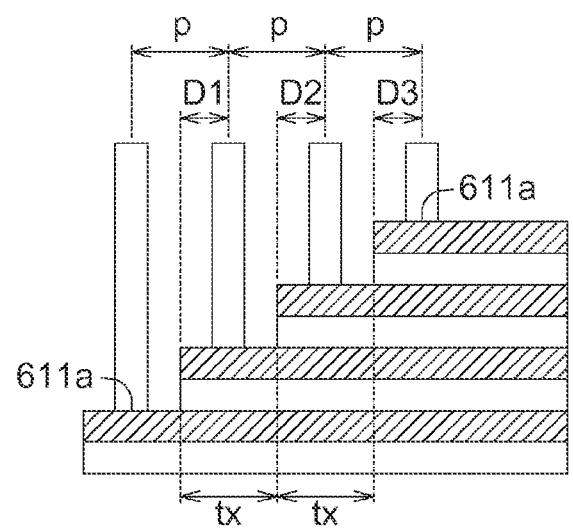
FIGS. 7 to 8 show the change of distances between the edge and the contact points.
Figure 8:
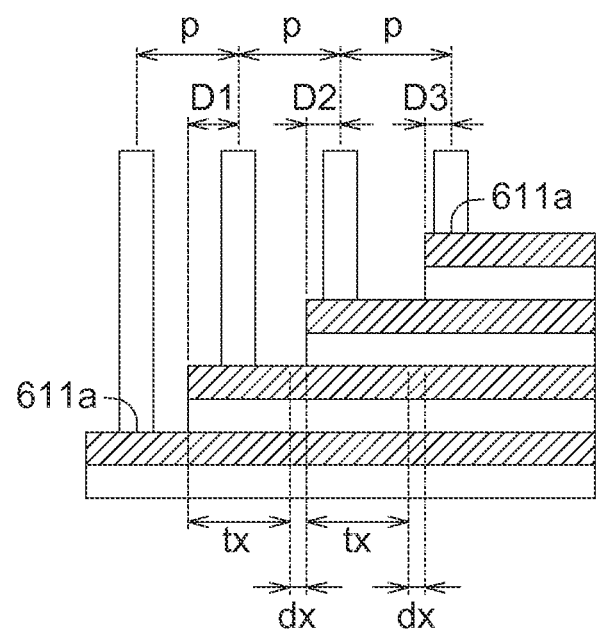

Moreover, please referring to FIGS. 7 to 8, the change of distances D1, D2 and D3 between the edge and the contact points 611a is shown. Pitches between any two adjacent contact points 611a are equal. As shown in FIG. 7, under an ideal case, the width tx for which the photoresist layer is trimmed is fixed. Therefore, in FIG. 7, the distances D1, D2 and D3 between the edge and the contact points 611a can be fixed at p/2.

As shown in FIG. 8, there is an error quantity dx for which a photoresist layer is trimmed. Therefore, in FIG. 8, the distance D2 between the edge and the contact point 611a becomes p/2−dx, the distance D3 between the edge and the contact point 611a becomes p/2−2dx, and so on. After the N layers of stacking structures 110 is trimmed N−1 times, the distance between the edge and the contact point 611a becomes p/2−(N−1)*dx. The distance between the edge and the contact point is needed to be larger than zero; therefore, the pitch p is needed to be larger than 2(N−1)*dx.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A 3D stacking semiconductor device, comprising:
   N layers of stacking structures, each of the stacking structures including:
   a conductive layer, wherein N is a positive number; and
   an insulating layer, wherein the conductive layers and the insulating layers are interlaced and stacked; and
   N pieces of conductive lines, wherein each conductive line is electrically connected to one contact point of each conductive layer;
   wherein the contact points are arranged along a first direction to form a P stages stair structure having a single layer interval, the contact points are arranged along a second direction to form a Q stages stair structure having a P stages interval, N≤P×Q, the contact points are arranged in a matrix along the first direction and the second direction, the first direction and the second direction are parallel to a top surface of the conductive layer, the first direction is parallel to an edge of a stage in the Q stages stair structure, and an included angle between the first direction and the second direction is an acute angle.

2. The 3D stacking semiconductor device according to claim 1, wherein the conductive lines are straightly extended from the contact pads in parallel.

3. The 3D stacking semiconductor device according to claim 1, wherein a pitch between two adjacent contact points satisfies the following equation:

$p \geq 2(N-1)*dx$, p is the pitch, and dx is an error quantity for which a photoresist layer is trimmed.

4. The 3D stacking semiconductor device according to claim 1, wherein P and Q are factors of N.

5. The 3D stacking semiconductor device according to claim 1, wherein Q is smaller than or equal to P.

6. The 3D stacking semiconductor device according to claim 1, wherein a P×Q stages stair structure is formed by the P stages stair structure and the Q stages stair structure, and the P×Q stages stair structure is arranged with P×Q stages interval along the first direction to form a P×Q×R stages structure.

7. The 3D stacking semiconductor device according to claim 6, wherein P, Q and R are factors of N.

8. The 3D stacking semiconductor device according to claim 6, wherein R is smaller than or equal to Q, and Q is smaller than or equal to P.

9. The 3D stacking semiconductor device according to claim 6, wherein the P×Q×R stages stair structure can be arranged with P×Q×R stages interval along the second direction to form a P×Q×R×S stages structure.

10. The 3D stacking semiconductor device according to claim 9, wherein P, Q, R and S are factors of N.

11. The 3D stacking semiconductor device according to claim 9, wherein S is smaller than or equal to R, R is smaller than or equal to Q, and Q is smaller than or equal to P.

12. A 3D stacking semiconductor device, comprising:
N layers of stacking structures, each of the stacking structures including:
a conductive layer; and
an insulating layer, wherein the conductive layers and the insulating layers are interlaced and stacked; and
N pieces of conductive lines, wherein each conductive line is electrically connected to one contact point of each conductive layer;
wherein the contact points are arranged along a first direction to form a P stages stair structure having a single layer interval, the contact points are arranged along a second direction to form a Q stages stair structure having a P stages interval, the contact points are arranged in a matrix along the first direction and the second direction, the first direction and the second direction are parallel to a top surface of the conductive layer, the first direction is parallel to an edge of a stage in the Q stages stair structure, and an included angle between the first direction and the second direction is an acute angle, a P×Q stages stair structure is formed by the P stages stair structure and the Q stages stair structure, and the P×Q stages stair structure is arranged with P×Q stages interval along the first direction to form a P×Q×R stages structure, N, P, Q and R are positive numbers, N≤P×Q×R, and P, Q and R are factors of N, the P×Q×R stages structure includes a first P×Q stages stair structure and a second P×Q stages stair structure connecting to the first P×Q stages stair structure, the first P×Q stages stair structure and the second P×Q stages stair structure are non-overlapping, the whole contact points of the first P×Q stages stair structure are located higher than the whole contact points of the second P×Q stages stair structure.

* * * * *